United States Patent
Morikazu (10) Patent No.: US 10,079,179 B2
(45) Date of Patent: Sep. 18, 2018

(54) WAFER PROCESSING METHOD

(71) Applicant: DISCO CORPORATION, Tokyo (JP)

(72) Inventor: Hiroshi Morikazu, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/365,406

(22) Filed: Nov. 30, 2016

(65) Prior Publication Data

US 2017/0162441 A1 Jun. 8, 2017

(30) Foreign Application Priority Data

Dec. 4, 2015 (JP) ................. 2015-237183

(51) Int. Cl.
| | |
|---|---|
| *H01L 21/30* | (2006.01) |
| *H01L 21/78* | (2006.01) |
| *H01L 21/268* | (2006.01) |
| *H01L 21/304* | (2006.01) |
| *H01L 21/306* | (2006.01) |
| *H01L 21/3065* | (2006.01) |
| *H01L 21/683* | (2006.01) |
| *H01L 23/544* | (2006.01) |
| *H01L 33/00* | (2010.01) |

(52) U.S. Cl.
CPC ............ *H01L 21/78* (2013.01); *H01L 21/268* (2013.01); *H01L 21/3043* (2013.01); *H01L 21/3065* (2013.01); *H01L 21/30604* (2013.01); *H01L 21/6836* (2013.01); *H01L 23/544* (2013.01); *H01L 33/0095* (2013.01); *H01L 33/007* (2013.01); *H01L 2221/68327* (2013.01); *H01L 2221/68336* (2013.01); *H01L 2221/68386* (2013.01); *H01L 2223/54453* (2013.01)

(58) Field of Classification Search
CPC ...... H01L 2924/14; H01L 2924/12042; B23K 2201/40
See application file for complete search history.

(56) References Cited

U.S. PATENT DOCUMENTS

2007/0298587 A1\* 12/2007 Park .................. B23K 26/0732
438/458

FOREIGN PATENT DOCUMENTS

JP 11-040520 2/1999

\* cited by examiner

*Primary Examiner* — Julio J Maldonado
*Assistant Examiner* — Andre' C Stevenson
(74) *Attorney, Agent, or Firm* — Greer Burns & Crain Ltd.

(57) ABSTRACT

A wafer is divided into a plurality of individual devices along a plurality of division lines, the wafer being composed of a substrate and a functional layer formed on the upper surface of the substrate through a buffer layer. The functional layer is partitioned by the division lines to define a plurality of separate regions where the devices are formed on the front side of the wafer. At least the functional layer is cut along the division lines. A protective member is provided on the front side of the wafer. The buffer layer is broken by applying a laser beam having a transmission wavelength to the substrate with the focal point of the laser beam set in the buffer layer, thereby breaking the buffer layer. The substrate is peeled from the functional layer, thereby forming the individual devices from the functional layer.

2 Claims, 6 Drawing Sheets

WAFER PROCESSING METHOD

BACKGROUND OF THE INVENTION

Field of the Invention

The present invention relates to a wafer processing method for dividing a thin wafer having a functional layer formed on the front side to obtain individual devices.

Description of the Related Art

There is a wafer composed of a substrate such as a sapphire substrate and an SiC substrate and a functional layer formed on the upper surface of the substrate through a buffer layer. The functional layer (called also light emitting layer or epitaxial layer) is composed of an n-type semiconductor layer and a p-type semiconductor layer. The functional layer is partitioned by a plurality of division lines to define a plurality of separate regions where a plurality of light emitting devices are formed on the front side of the wafer. Further, there is a wafer composed of the above-mentioned substrate and a functional layer formed on the upper surface of the substrate through a buffer layer, wherein the functional layer is formed from a GaN semiconductor layer. This functional layer is partitioned by a plurality of division lines to define a plurality of separate regions where a plurality of power devices are formed on the front side of the wafer. In either case, the wafer is cut along the division lines by using a dividing apparatus such as a laser processing apparatus, thereby obtaining the individual light emitting devices or power devices, which are used in various illuminating equipment or electrical equipment such as television set.

Each device mentioned above is used in a mobile phone, wrist watch having a communications function, etc., and it is therefore desirable to develop a technique of further reducing the thickness of each device in order to further reduce the size and weight of each equipment mentioned above. As a technique of reducing the thickness of each device in dividing a wafer into devices, there has already been proposed a technique called dicing before grinding (see Japanese Patent Laid-Open No. 1999-040520, for example).

This technique includes the steps of first forming a groove having a depth corresponding to the finished thickness of each device on the front side of a wafer along each division line, next providing a protective member on the front side of the wafer, and next grinding the back side of the wafer until the groove is exposed to the back side of the wafer, thereby dividing the wafer into the individual devices.

SUMMARY OF THE INVENTION

The technique described in Japanese Patent Laid-Open No. 1999-040520 is a technique of reducing the thickness of each device by grinding the back side of the wafer. However, in the case of using a hard substrate such as a sapphire substrate and an SiC substrate as the substrate of the wafer, it is difficult to grind the back side of the wafer. Accordingly, in this case, it is difficult to reduce the thickness of each device by using the dicing before grinding technique mentioned above.

It is therefore an object of the present invention to provide a wafer processing method which can reduce the thickness of each device even in the case of using a hard wafer as a wafer having a functional layer.

In accordance with an aspect of the present invention, there is provided a wafer processing method for dividing a wafer into a plurality of individual devices along a plurality of division lines, the wafer being composed of a substrate and a functional layer formed on the upper surface of the substrate through a buffer layer, the functional layer being partitioned by the division lines to define a plurality of separate regions where the devices are formed on the front side of the wafer, the wafer processing method including a cutting step of cutting at least the functional layer along the division lines; a protective member providing step of providing a protective member on the front side of the wafer after performing the cutting step; a buffer layer breaking step of applying a laser beam having a transmission wavelength to the substrate in the condition where the focal point of the laser beam is set in the buffer layer after performing the protective member providing step, thereby breaking the buffer layer; and a substrate peeling step of peeling the substrate from the functional layer after performing the buffer layer breaking step, thereby forming the individual devices from the functional layer.

Preferably, the protective member providing step includes the steps of attaching an adhesive tape as the protective member to the front side of the wafer and attaching a peripheral portion of the adhesive tape to an annular frame having an inside opening so that the wafer is received in the inside opening of the annular frame, thereby supporting the wafer through the adhesive tape to the annular frame; the wafer processing method further including a pickup step of expanding the adhesive tape to increase the spacing between any adjacent ones of the devices and next picking up each device from the adhesive tape, after performing the substrate peeling step.

Preferably, the cutting step includes any one of a cutting step using a cutting blade, a cutting step using a laser beam, a cutting step using plasma etching, and a cutting step using wet etching.

According to the wafer processing method of the present invention, the following effects can be exhibited. In the case that the substrate is a hard substrate such as a sapphire substrate and an SiC substrate and that the functional layer formed by using this hard substrate is divided into the individual devices, the substrate can be peeled from the functional layer without grinding the substrate. As a result, a very thin device can be obtained.

Further, since the substrate is peeled from the functional layer without grinding the substrate, the substrate peeled from the functional layer can be reused as a substrate for forming a new functional layer. Thus, the present invention also has an advantage in economy.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
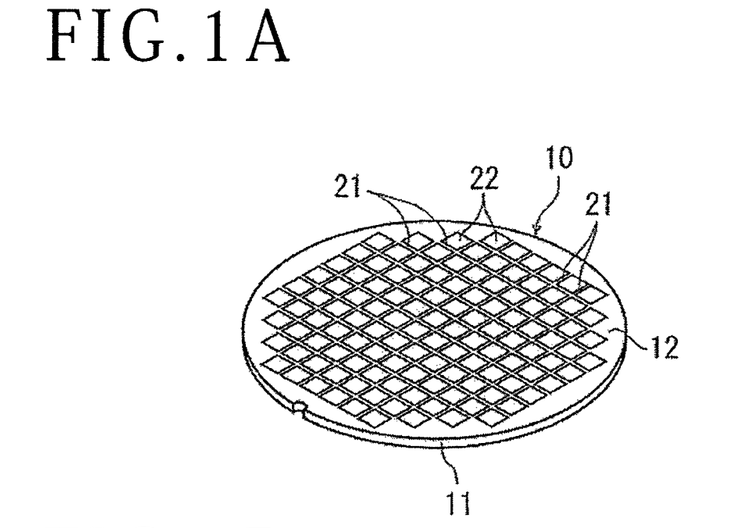
FIG. 1A is a perspective view of an optical device wafer.
Figure 1B:
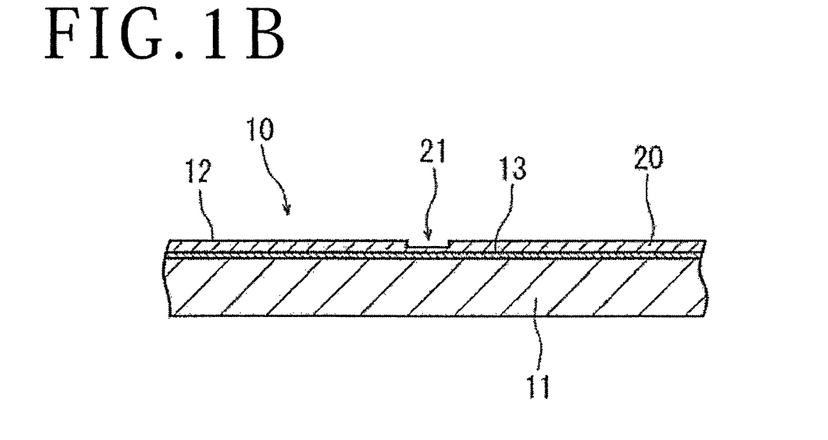
FIG. 1B is an enlarged sectional view of an essential part of the optical device wafer shown in FIG. 1A.

A wafer processing method according to a preferred embodiment of the present invention will now be described in detail with reference to the attached drawings. FIG. 1A is a perspective view of an optical device wafer 10 as a workpiece, and FIG. 1B is an enlarged sectional view of an essential part of the optical device wafer 10 shown in FIG. 1A. As shown in FIGS. 1A and 1B, the optical device wafer 10 includes a substantially disk-shaped epitaxy substrate 11 and an optical device layer 12 formed on the upper surface (front side) of the epitaxy substrate 11 by epitaxial growth. The epitaxy substrate 11 is formed of sapphire, and the optical device layer 12 is composed of an n-type gallium nitride semiconductor layer and a p-type gallium nitride semiconductor layer.

In forming the optical device layer 12 on the upper surface of the epitaxy substrate 11 by epitaxial growth, a buffer layer 13 is formed between the epitaxy substrate 11 and the optical device layer 12. The buffer layer 13 is formed of gallium nitride (GaN) and has a thickness of 1 µm, for example. In this optical device wafer 10, the optical device layer 12 has a thickness of 5 µm, for example. The upper surface (front side) of the optical device layer 12 is partitioned by a plurality of crossing division lines 21 to define a plurality of separate regions where a plurality of devices 22 are formed.

A wafer processing method for dividing the optical device wafer 10 into the individual devices 22 along the division lines 21 will now be described more specifically with reference to the attached drawings.
(Cutting Step)

Figure 2A:
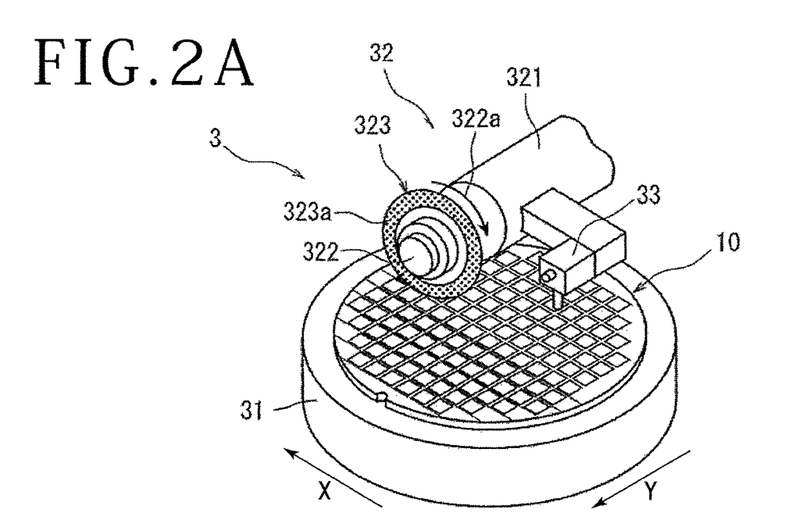
FIGS. 2A to 2C are views for illustrating a cutting step.
Figure 2B:
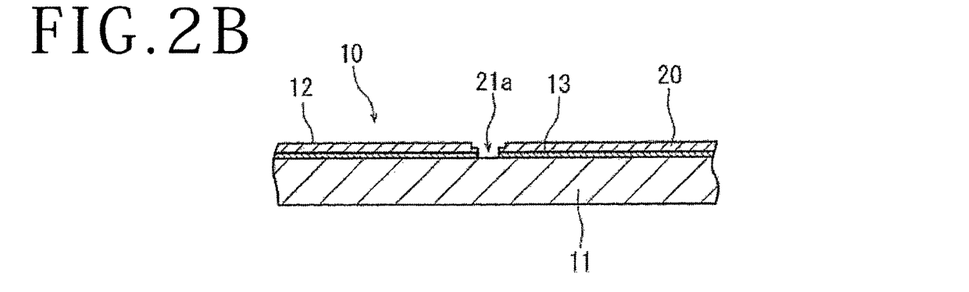
Figure 2C:
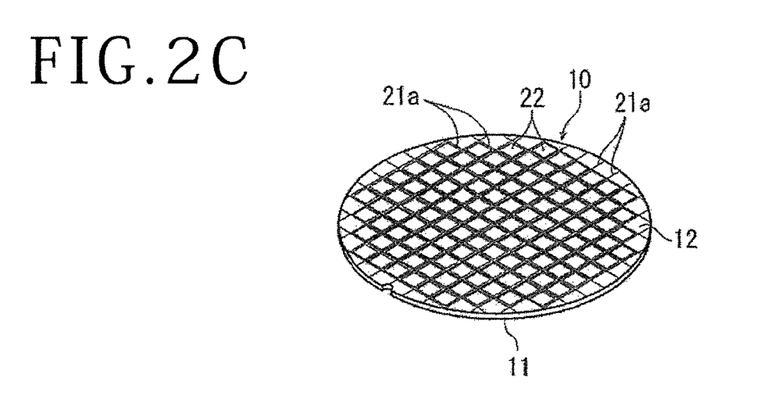

As shown in FIGS. 2A to 2C, a cutting blade having a predetermined thickness is used to cut at least the optical device layer 12 as a functional layer along the division lines 21 on the front side of the optical device wafer 10, thereby forming a cut groove 21a along each division line 21. The cut groove 21a has a depth corresponding to the thickness of at least the optical device layer 12.

Referring to FIG. 2A, a cutting apparatus 3 for performing the cutting step is shown. The cutting apparatus 3 includes a chuck table 31 for holding a workpiece, cutting means 32 for cutting the workpiece held on the chuck table 31, and imaging means 33 for imaging the workpiece held on the chuck table 31. The chuck table 31 has an upper surface for holding the workpiece thereon under suction. The chuck table 31 is movable in a feeding direction (X direction) shown by an arrow X in FIG. 2A by feeding means (not shown) and also movable in an indexing direction (Y direction) shown by an arrow Y in FIG. 2A by indexing means (not shown).

The cutting means 32 includes a spindle housing 321 extending in a substantially horizontal direction, a spindle 322 rotatably supported to the spindle housing 321, and a cutting blade 323 mounted on the front end portion of the spindle 322. The cutting blade 323 has an annular cutting edge 323a. The spindle 322 is rotationally driven by a servo motor (not shown) provided in the spindle housing 321 so as to be rotated in the direction shown by an arrow 322a. The imaging means 33 includes optical means such as a microscope and a charge-coupled device (CCD) camera. An image signal output from the imaging means 33 is transmitted to control means (not shown). The imaging means 33 and this control means perform image processing such as pattern matching for making the alignment between each division line 21 formed on the optical device wafer 10 and the cutting blade 323, thereby performing the alignment for a cutting area.

After performing the alignment as mentioned above, the chuck table 31 holding the optical device wafer 10 is moved to a cutting start position in the cutting area in such a manner that a predetermined one of the division lines 21 is aligned with the cutting blade 323 in the X direction. The optical device wafer 10 is held on the chuck table 31 in the condition where the optical device layer 12 is oriented upward. At the cutting start position, the cutting blade 323 is lowered and rotated at a predetermined speed. Thereafter, the chuck table 31 is moved in the X direction at a predetermined feed speed. When the chuck table 31 is moved to a cutting end position in the X direction, the movement of the chuck table 31 is stopped. As a result, the cut groove 21a is formed along the predetermined division line 21 (cut groove forming step). Thereafter, the cutting blade 323 is raised and the chuck table 31 is indexed in the Y direction by the pitch of the division lines 21. Thereafter, the chuck table 31 is moved in the X direction so that the next division line 21 is aligned with the cutting blade 323. Thereafter, the cut groove forming step is similarly performed along the next division line 21. In this manner, the cut groove forming step is similarly performed along all of the division lines 21 formed on the front side of the optical device wafer 10 (see FIG. 2C). In this cutting step, the depth of cut by the cutting blade 323 is set so that the buffer layer 13 is also cut in addition to the optical device layer 12. Thus, the cutting step is finished.
(Protective Member Providing Step)

Figure 3:
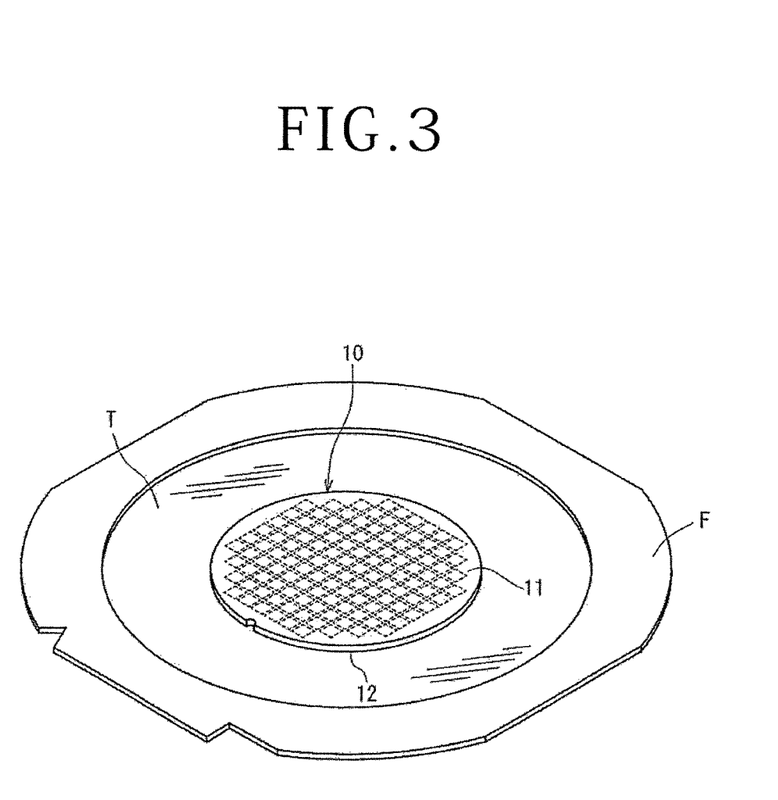
FIG. 3 is a perspective view for illustrating a protective member providing step.

After performing the cutting step to the optical device wafer 10, a protective member providing step is performed in such a manner that an adhesive tape T as a protective member is attached to the front side of the optical device wafer 10, i.e., to the optical device layer 12. More specifically, as shown in FIG. 3, the adhesive tape T as a protective member is supported at its peripheral portion to an annular frame F having an inside opening. That is, the annular frame F is attached to the peripheral portion of the adhesive tape T so that the inside opening of the annular frame F is closed by the adhesive tape T. The front side of the optical device wafer 10, i.e., the optical device layer 12 is attached to the adhesive tape T at its central portion exposed to the inside opening of the annular frame F. Thus, the protective member providing step is finished. Accordingly, the optical device wafer 10 is attached to the adhesive tape T in the condition where the back side of the optical device wafer 10, i.e., the epitaxy substrate 11 is oriented upward.
(Buffer Layer Breaking Step)

Figure 4A:
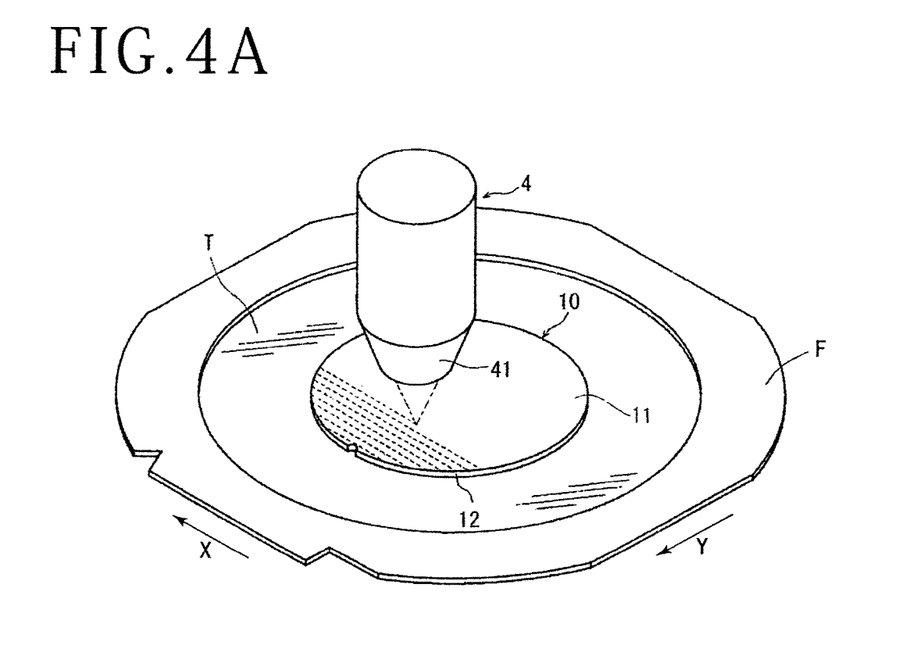
FIGS. 4A and 4B are views for illustrating a buffer layer breaking step.
Figure 4B:
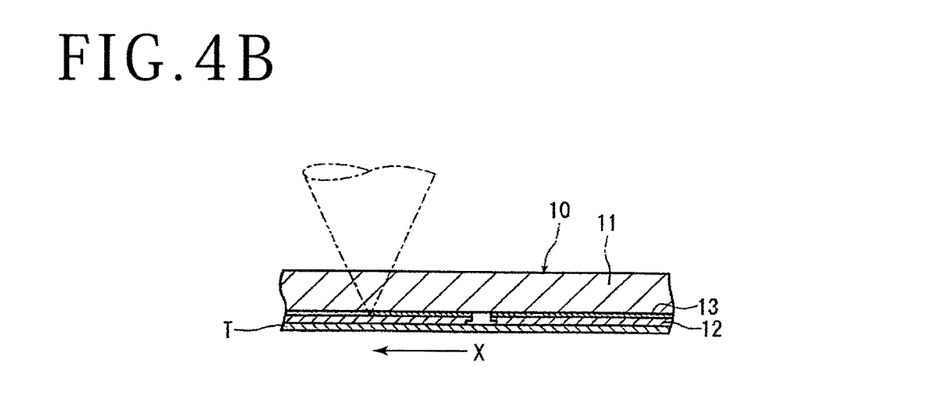

After performing the protective member providing step, a buffer layer breaking step is performed by using a laser processing apparatus including laser beam applying means 4 as shown in FIGS. 4A and 4B. The laser processing apparatus may be any laser processing apparatus known in the art. Accordingly, the whole structure and details of the laser processing apparatus will be omitted herein.

As shown in FIGS. 4A and 4B, in performing the buffer layer breaking step, the optical device wafer 10 supported through the adhesive tape T to the annular frame F is placed on a chuck table (not shown) included in the laser processing apparatus in the condition where the adhesive tape T is in contact with the upper surface of the chuck table. Accordingly, the optical device wafer 10 is placed on the chuck table in the condition where the epitaxy substrate 11 is oriented upward. Thereafter, suction means (not shown) is operated to hold the optical device wafer 10 through the adhesive tape T on the chuck table (wafer holding step). Although not shown in FIG. 4A, the annular frame F is held by any suitable frame holding member provided on the chuck table.

After performing the wafer holding step, the chuck table holding the optical device wafer 10 is moved to a processing area where the wafer 10 is to be laser-processed by the laser processing apparatus. That is, as shown in FIG. 4A, the optical device wafer 10 is positioned directly below focusing means 41 included in the laser beam applying means 4. Thereafter, as shown in FIG. 4B, the laser beam applying means 4 is operated by a control signal output from control means (not shown) to apply a pulsed laser beam to the buffer layer 13 from the back side of the optical device wafer 10, i.e., from the epitaxy substrate 11 side, wherein the pulsed laser beam has a wavelength transmissive to sapphire forming the epitaxy substrate 11 and absorptive to gallium nitride (GaN) forming the buffer layer 13, thereby breaking the buffer layer 13. At this time, the chuck table is moved in a feeding direction (X direction) shown by an arrow X in FIG. 4A and in an indexing direction (Y direction) shown by an arrow Y in FIG. 4A, so that the spot of the pulsed laser beam from the focusing means 41 is applied to the whole area of the buffer layer 13 of the optical device wafer 10 (laser beam applying step). As a result, the whole area of the buffer layer 13 formed between the optical device layer 12 and the epitaxy substrate 11 is broken to thereby lose its bonding function of bonding the epitaxy substrate 11 and the optical device layer 12.

For example, the laser beam applying step is performed under the following processing conditions.

Light source: diode-pumped solid-state (DPSS) laser
Wavelength: 266 nm
Repetition frequency: 50 kHz
Power: 0.2 W
Spot diameter: 50 μm
Pulse width: 10 ps
Feed speed: 1000 mm/second (Substrate Peeling Step)

Figure 5:
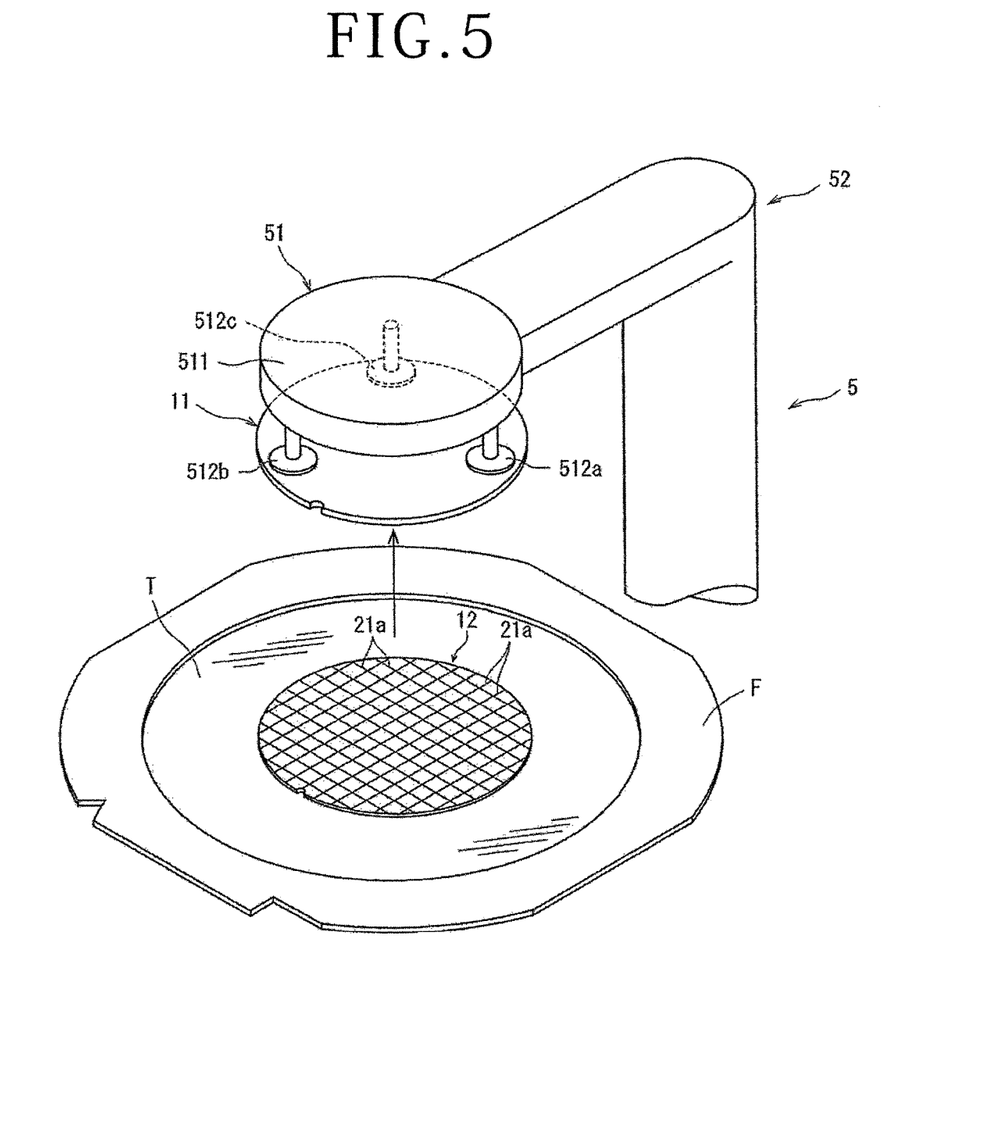
FIG. 5 is a perspective view for illustrating a substrate peeling step.

After performing the buffer layer breaking step, a substrate peeling step is performed to peel the epitaxy substrate 11 from the optical device layer 12 (see FIG. 5). More specifically, after performing the buffer layer breaking step, the chuck table holding the optical device wafer 10 is moved to a peeling position where a peeling mechanism 5 is located as shown in FIG. 5. The peeling mechanism 5 includes supporting means 52 and suction holding means 51 supported to the supporting means 52. The suction holding means 51 includes a base 511 and three suction pads 512a, 512b, and 512c supported to the base 511. At the peeling position, the optical device wafer 10 held on the chuck table is positioned directly below the suction holding means 51 supported to the supporting means 52. Thereafter, the suction holding means 51 is lowered until the suction pads 512a to 512c supported to the base 511 come into contact with the epitaxy substrate 11 of the optical device wafer 10. In the condition where the suction pads 512a to 512c are in contact with the back side (upper surface as viewed in FIG. 5) of the epitaxy substrate 11, suction means (not shown) is operated to apply a vacuum through the supporting means 52 and the base 511 to the suction pads 512a to 512c, thereby holding the back side of the epitaxy substrate 11 under suction. When the epitaxy substrate 11 is held under suction by the suction pads 512a to 512c, the suction holding means 51 is raised to thereby move the suction pads 512a to 512c holding the epitaxy substrate 11 away from the optical device layer 12.

Thus, the epitaxy substrate 11 is peeled from the optical device layer 12, and this substrate peeling step is finished. After performing the substrate peeling step, the epitaxy substrate 11 is stored into an epitaxy substrate storage container (not shown). On the other hand, the plural devices 22 divided from each other are kept attached to the adhesive tape T held on the chuck table. In the case that a heating and cooling step for the buffer layer 13 of the optical device wafer 10 is interposed between the buffer layer breaking step and the substrate peeling step, the substrate peeling step can be performed more reliably.

(Pickup Step)

After performing the substrate peeling step, a pickup step is performed to pick up each device 22 from the adhesive tape T. This pickup step is performed by using a pickup apparatus 6, a part of which being shown in FIG. 6. The pickup apparatus 6 includes a frame holding member 61 having an upper surface for mounting the annular frame F, a plurality of clamps 62 for holding the annular frame F mounted on the upper surface of the frame holding member 61, and a cylindrical expansion drum 63 for expanding the adhesive tape T supported to the annular frame F held by the clamps 62, thereby increasing the spacing between any adjacent ones of the individual devices 22 attached to the adhesive tape T. At least the upper end of the cylindrical expansion drum 63 is open. The frame holding member 61 is vertically movably supported by supporting means 623. The supporting means 623 is composed of a plurality of air cylinders 623a located around the expansion drum 63 and a plurality of piston rods 623b extending from the upper ends of the air cylinders 623a. The upper ends of the piston rods 623b are connected to the lower surface of the frame holding member 61.

Figure 6:
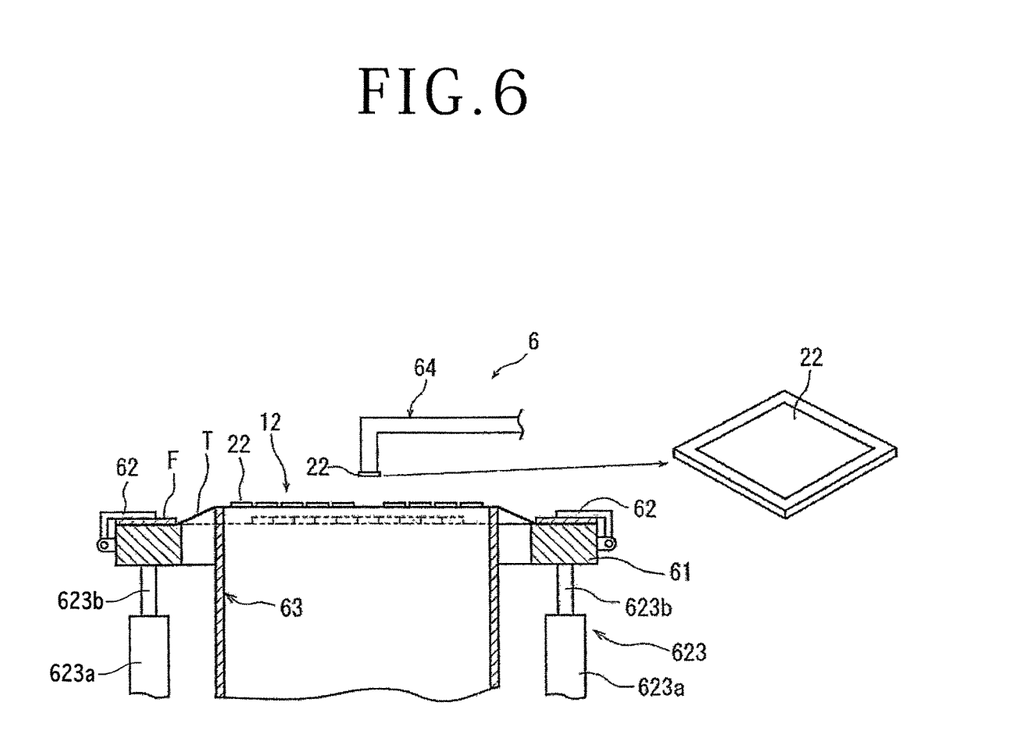
FIG. 6 is a sectional side view for illustrating a pickup step.

The expansion drum 63 has an outer diameter smaller than the inner diameter of the annular frame F and an inner diameter larger than the outer diameter of the optical device wafer 10 (optical device layer 12) attached to the adhesive tape T supported to the annular frame F. As shown in FIG. 6, the frame holding member 61 is vertically movable between a standby position (shown by a phantom line) where the upper surface of the frame holding member 61 is at substantially the same level as that of the upper end of the expansion drum 63 and a working position (shown by a solid line) where the upper surface of the frame holding member 61 is lower in level than the upper end of the expansion drum 63. This working position is obtained by operating the supporting means 623 to lower the frame holding member 61.

When the upper end of the expansion drum 63 is relatively changed from the position shown by the phantom line to the position shown by the solid line by lowering the frame holding member 61, the upper end of the expansion drum 63 becomes higher in level than the upper surface of the frame holding member 61, so that the upper end of the expansion drum 63 comes into abutment against the lower surface of the adhesive tape T supported to the annular frame F and is then expanded. As a result, a radial tensile force acts on the optical device wafer 10 (optical device layer 12) attached to the adhesive tape T, thereby increasing the spacing between any adjacent ones of the individual devices 22 already divided from each other. Thereafter, a pickup collet 64 is operated in the condition where the spacing between the adjacent devices 22 has been increased, thereby holding each device 22 under suction and peeling it from the adhesive tape T. Thereafter, each device 22 is transferred to a storage tray (not shown) by the pickup collet 64. Thus, the pickup step is finished. In this manner, all of the steps of the wafer processing method according to this preferred embodiment are performed. While both the optical device layer 12 and the buffer layer 13 are cut in the cutting step in this preferred embodiment, the present invention is not limited to this embodiment. That is, the depth of cut by the cutting blade is set so that at least the optical device layer 12 must be cut in the cutting step according to the present invention. Accordingly, in the case that the buffer layer 13 is not completely cut in the cutting step, the buffer layer 13 is completely divided by the expansion of the adhesive tape T in the pickup step.

The wafer processing method according to the present invention is not limited to the specific configuration described in the above preferred embodiment. While the above preferred embodiment is a method of processing a wafer composed of an epitaxy substrate formed of sapphire and a functional layer (optical devices) formed on the epitaxy substrate, the present invention is also applicable to the case of processing a semiconductor wafer composed of an SiC substrate and a functional layer (power devices) formed on the SiC substrate, for example. Further, while the present invention is effective in the case of using a hard substrate, the present invention is not necessarily applied to such a hard substrate. That is, the present invention is also effective in the case of using a substrate having low hardness. Also in this case, thin devices can be easily manufactured as compared with the prior art and effects similar to those of the above preferred embodiment can be exhibited.

Further, while a cutting blade is used as specific means for performing the cutting step to form a cut groove along each division line in the above preferred embodiment, the present invention is not limited to this configuration. That is, examples of the means for forming the cut groove further include cutting means using a laser beam, cutting means using plasma etching, and cutting means using wet etching. Any one of these cutting means may be selected.

Further, in the protective member providing step in this preferred embodiment, the adhesive tape T as a protective member is attached to the front side of the wafer 10, and the peripheral portion of the adhesive tape T is attached to the annular frame F so that the wafer 10 is received in the inside opening of the annular frame F. In this manner, the wafer 10 is supported through the adhesive tape T to the annular frame F. That is, the adhesive tape T as the protective member is provided on the front side of the wafer 10. However, the present invention is not limited to this configuration. For example, a tape as a protective member having the same shape as that of the wafer may be simply attached to the front side of the wafer, thereby providing the protective member. As another example, resin or the like may be applied to the front side of the wafer, thereby forming a protective film as a protective member.

According to the present invention, in processing a wafer composed of a substrate and a functional layer formed on the substrate through a buffer layer, the substrate can be substantially completely removed from the wafer by performing the buffer layer breaking step and the substrate peeling step. Accordingly, as compared with a device formed by dicing before grinding, a very thin device can be formed from only the functional layer. By using this device for a mobile phone, wrist watch having a communications function, etc., the present invention can contribute to a further reduction in size and weight of such equipment. Further, the substrate is peeled from the functional layer without grinding the substrate. Accordingly, the substrate peeled from the functional layer can be reused as a substrate for forming a new functional layer. Thus, the present invention also has an advantage in economy.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer into a plurality of individual devices along a plurality of division lines, said wafer being composed of a substrate and a functional layer formed on an upper surface of said substrate through a buffer layer, said functional layer being partitioned by said division lines to define a plurality of separate regions where said devices are formed on a front side of said wafer, said wafer processing method comprising:

a cutting step of cutting at least said functional layer along said division lines;

a protective member providing step of providing a protective member on the front side of said wafer after performing said cutting step;

a buffer layer breaking step of applying a laser beam having a transmission wavelength to said substrate in a condition where the focal point of said laser beam is set in said buffer layer after performing said protective member providing step, thereby breaking said buffer layer; and a substrate peeling step of peeling said substrate from said functional layer after performing said buffer layer breaking step, thereby forming said individual devices from said functional layer wherein said protective member providing step includes the steps of attaching an adhesive tape as said protective member to the front side of said wafer and attaching a peripheral portion of said adhesive tape to an annular frame having an inside opening so that said wafer is received in said inside opening of said annular frame, thereby supporting said wafer through said adhesive tape to said annular frame, said wafer processing method further comprising a pickup step of expanding said adhesive tape to increase the spacing between any adjacent ones of said devices and next picking up each device from said adhesive tape, after performing said substrate peeling step.

2. The wafer processing method according to claim 1, wherein said cutting step includes any one of a cutting step using a cutting blade, a cutting step using a laser beam, a cutting step using plasma etching, and a cutting step using wet etching.

* * * * *